US012787233B2

(12) United States Patent
Kammer et al.

(10) Patent No.: US 12,787,233 B2
(45) Date of Patent: Nov. 3, 2026

(54) MOUNTING ARRANGEMENT FOR INTEGRATED MOTOR-DRIVE

(71) Applicant: ABB Schweiz AG, Baden (CH)

(72) Inventors: Christoph Kammer, Raleigh, NC (US); William J. Eakins, Coventry, CT (US); Eddy C. Aeloiza, Apex, NC (US)

(73) Assignee: ABB Schweiz AG, Baden (CH)

(*) Notice: Subject to any disclaimer, the term of this patent is extended or adjusted under 35 U.S.C. 154(b) by 186 days.

(21) Appl. No.: 18/657,454

(22) Filed: May 7, 2024

(65) Prior Publication Data

US 2025/0351312 A1 Nov. 13, 2025

(51) Int. Cl.
*H05K 7/20* (2006.01)
*H02K 9/04* (2006.01)

(52) U.S. Cl.
CPC ............... *H05K 7/209* (2013.01); *H02K 9/04* (2013.01); *H05K 7/20909* (2013.01)

(58) Field of Classification Search
CPC ..... H02K 9/227; H05K 7/209; H05K 7/20909
USPC ............................ 310/64, 216.014, 216.056
See application file for complete search history.

(56) References Cited

U.S. PATENT DOCUMENTS

| | | | | |
|---|---|---|---|---|
| 7,781,926 | B2 * | 8/2010 | Schmidt | H02K 5/06 310/77 |
| 10,439,475 | B2 * | 10/2019 | Madsen Obel | H02K 5/18 |
| 10,693,347 | B2 * | 6/2020 | Li | H02K 5/18 |

OTHER PUBLICATIONS

Baldor-Reliance, "ECS100T2H2DB4 Product Catalog," product brochure downloaded from the Internet at https://www.baldor.com/catalog/ECS100T2H2DB4 on May 7, 2024, 4 pp.
Baldor-Reliance, "Customer information packet ECS100T2H2DB4," product brochure downloaded from the Internet at https://www.baldor.com/catalog/ECS100T2H2DB4/infopacket on May 7, 2024, 7 pp.

* cited by examiner

*Primary Examiner* — Christopher M Koehler
*Assistant Examiner* — Ahmed F Seck
(74) *Attorney, Agent, or Firm* — Fitch Even Tabin & Flannery LLP

(57) ABSTRACT

An integrated motor-drive includes an electric motor, a drive unit, and a cantilevered heatsink that connects the drive unit to the motor frame of the electric motor. The cantilevered heatsink can include a drive platform that supports and separates the drive unit with respect to the top of the motor frame by a heatsink air gap in a cantilevered arrangement. The cantilevered heatsink can also include a heatsink support that physically and thermally connects the drive platform to the end shield at the non-drive end of the motor frame. A drive unit may be axially mounted to the non-drive end to direct airflow against the end shield and dissipate heat energy though convection.

16 Claims, 5 Drawing Sheets

MOUNTING ARRANGEMENT FOR INTEGRATED MOTOR-DRIVE

BACKGROUND

Integrated motor-drives are combinations of an electric motor and a drive unit that are integrated together and provided as a standalone unit. The electric motor may be an alternating current (AC) or direct current (DC) motor that converts an electrical power input to a motive force or torque typically transmitted through a rotating shaft. The drive unit can include electronics and electric circuitry to modify the electrical power input to produce a particular desired output of the motive force. For example, the drive unit may be capable of adjusting the electric current or the frequency of the electrical power input to change the torque or rotation speed of the motive force output. Motor-drives may be used in industrial applications like fans, pumps, and the like to vary their operation to match the present requirements.

As stated, in an integrated motor-drive, the electric motor and the drive unit are assembled together in an integrated combination. An advantage of integrated motor-drives is that they provide a compact arrangement of an electric motor and the components for adjustably controlling the motor and which can be sized to meet standardized settings and configurations such as, for example, the National Electrical Manufactures Association ("NEMA") frame size designations. Another advantage of integrated motor-drives is that the integrated combination typically requires fewer external connections and cabling than if the components and their functionality were spatially separated and distributed.

Electric motors may generate a significant amount of thermal energy and heat during operation due to, for example, electrical resistance and impedance to current conduction in the windings, eddy currents, hysteresis losses, and the like. The electric motor and, in particular, the motor frame or enclosure is designed to manage and transfer heat away from the motor and avoid detrimental impact to operation. In addition to motor losses, the drive units also generate heat due to the operation of the electronic components such as transistors included in the drive units. To manage the heat generated by motor and drive, the present disclosure is directed to a mounting arrangement for an integrated motor-drive configured to advantageously interconnect the drive unit to the electric motor to promote thermal transfer among the structures and more effectively cool the combination.

BRIEF SUMMARY

The disclosure describes an integrated motor-drive including an electric motor having an external motor frame, a drive unit, and a cantilevered heatsink that supports the drive unit with respect to the motor frame. The cantilevered heatsink includes a drive platform that extends over the motor frame and is radially offset from and parallel to a rotational axis of the electric motor. The drive unit can be mounted to the drive platform in a top mounted configuration. To ventilate the drive unit and the electric motor, the cantilevered configuration of the cantilevered heatsink creates a heatsink air gap that spaces the drive platform and the motor frame apart. To attach to the motor frame in a cantilevered arrangement, the cantilevered heatsink includes a heatsink support formed orthogonally at an edge of the drive platform and that can be arranged normal to the rotational axis. The heatsink support can physically abut and connect with the circular edge or peripheral rim of the non-drive end (NDE) end shield of the motor frame. The heatsink support can also radially offset and space apart the drive platform and the motor frame to create the heatsink air gap.

Physically supporting the drive platform by the NDE end shield of the motor frame via the heatsink minimizes heat transfer from motor to drive and may further improve heat dissipation by conducting heat to the NDE end shield which may be cooler due to an axially mounted cooling fan unit. Further, the heatsink air gap between the drive platform and motor frame provided by the cantilevered arrangement allows for convective heat transfer via airflow that may be directed between the components. These and other possible advantages and features of the disclosure will be apparent from the following detailed description and accompanying drawings.

DETAILED DESCRIPTION

Figure 1:
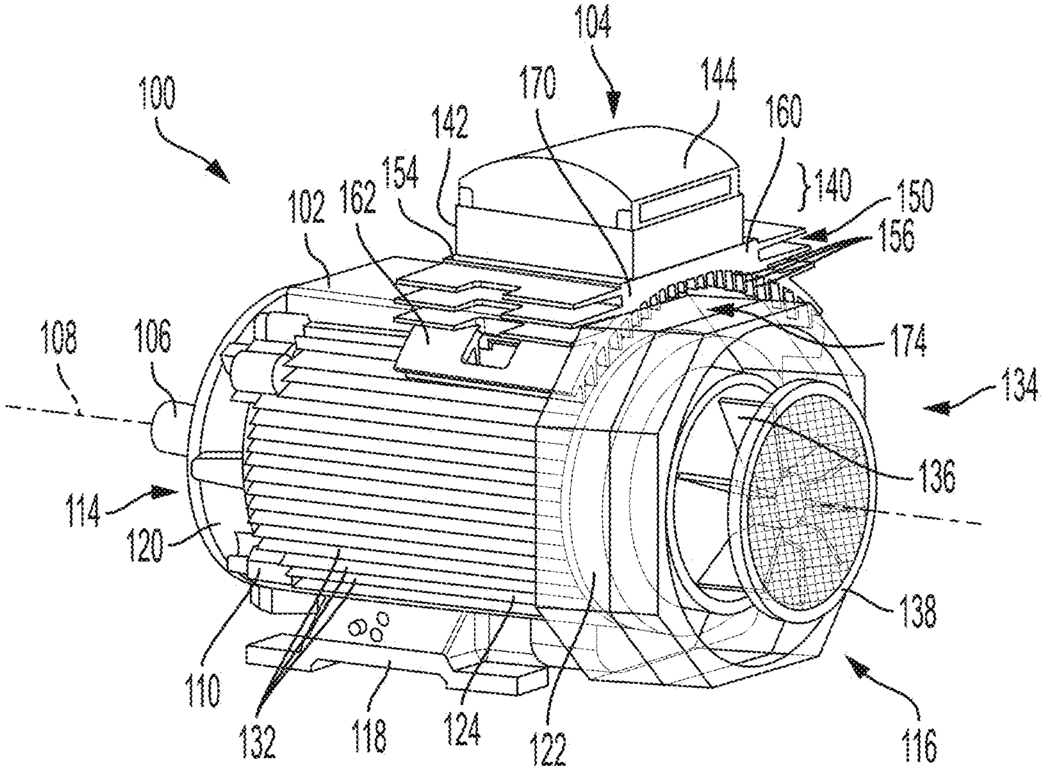
FIG. 1 is a perspective view of an integrated motor-drive including an electric motor with a TEFC motor frame and a drive unit mounted together by a cantilevered heatsink to physically and thermally connect to the end shield of the motor frame.
Figure 2:
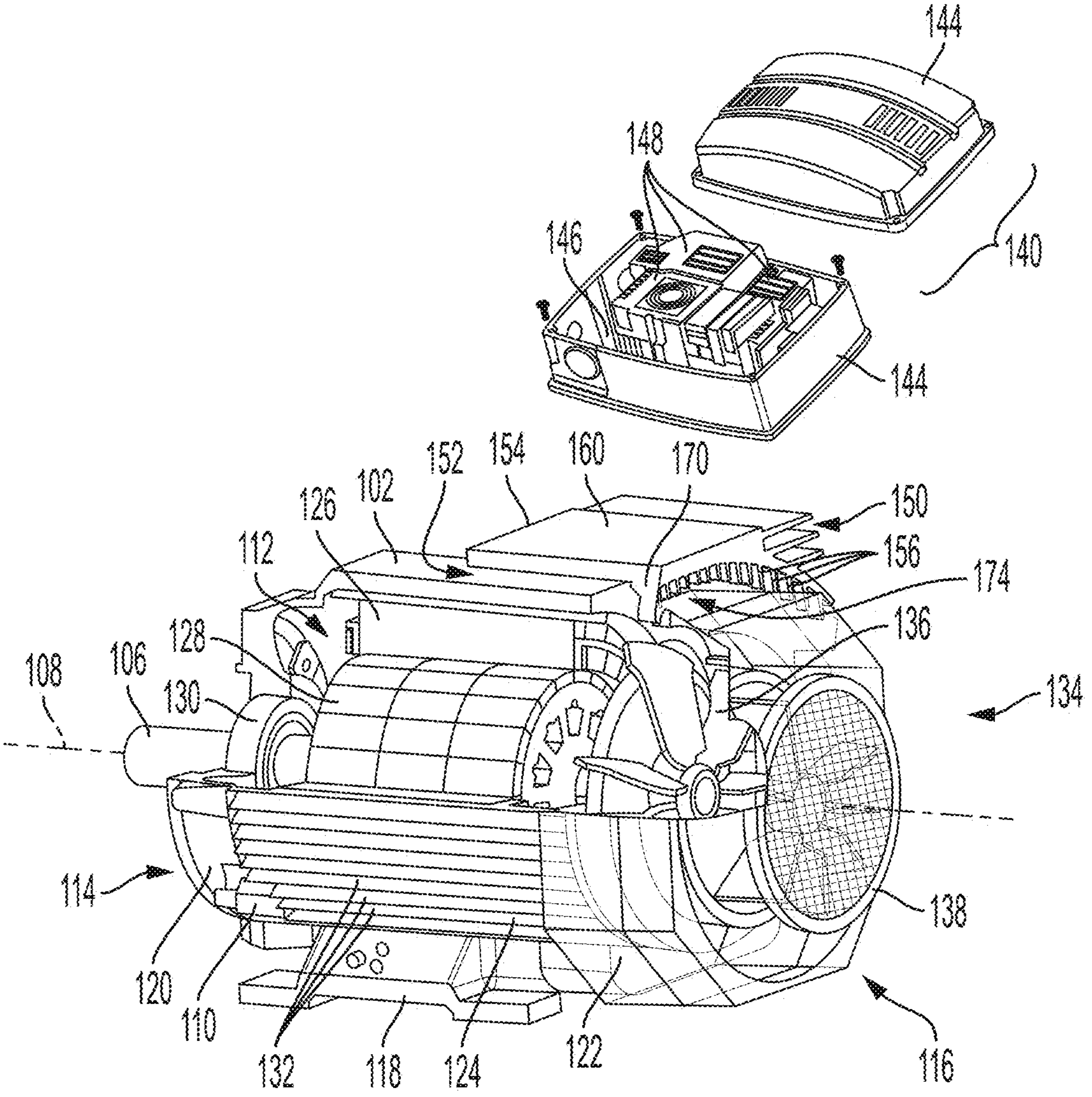
FIG. 2 is a partial cutaway perspective view of the integrated motor-drive illustrating the arrangement of the air gap formed between the cantilevered heatsink and the exterior surface of the motor frame to promote airflow.

Now referring to the drawings, wherein whenever possible like reference numbers refer to like elements, there is illustrated in FIGS. 1 and 2 an integrated motor-drive 100 including an electric motor 102 with an electronic drive unit 104 mounted thereto in accordance with the disclosure. The electric motor 102 can convert electrical energy to mechanical rotating power or torque that may be transmitted through a rotating motor shaft 106 to be harnessed for other work. The motor shaft 106 that extends through the electrical motor 102 defines the rotational axis 108 of the integrated motor-drive 100.

For reference purposes, the rotational axis 108 of the electric motor 102 can establish an axial or longitudinal direction parallel with the rotational axis and a radial direction that is perpendicular to the rotational axis. The radial direction may further establish the lateral sides of the integrated motor-drive 100 that are radially offset from the rotational axis 108 and the top and bottom directions of the integrated motor drive. For example, the drive unit 104 is mounted above the electric motor 102 and is situated toward the top of the integrated motor-drive 100.

The electric motor 102 can be of any suitable construction and may utilize any suitable electromechanical operating principles such as, for example, an alternating current motor operating on single or polyphase power. The electric motor 102 may be intended and designed for industrial applications such as fans, blowers, pumps, etc., and can range in power output from fractional kilowatts to several hundred kilowatts. Aspects of the disclosure may be applicable to other types of electrical motors such as direct current stepper motors or servomotors. The drive unit 104 is an electronic controller that can modify the electrical power received from a source by the electric motor 102 to achieve the desired output in terms of motor speed or torque. The electric motor 102 and the drive unit 104 are combined as an integrated package to reduce the overall footprint or volume of the motor-drive 100 and to reduce power cabling and signal cabling between the electrical motor and its controls.

To enclose and support the interacting internal components, the electric motor 102 includes a motor frame 110 configured as a hollow exterior structure that defines an internal cavity or enclosed interior 112. The motor frame 110 is oriented with respect to the rotational axis 108 of the electric motor 102 and can include and extend between a drive end 114 and an axially opposite non-drive end 116. The motor shaft 106 can protrude from the motor frame 110 at the drive end 144 to operatively couple with driven components for the transmission of motive power and torque. In an embodiment, to situate and support the electric motor 102 on a mounting surface such as floor, the motor frame 110 can include a pair of mounting feet 118 that are radially offset from motor shaft 106 toward the lateral bottom of the electric motor 102. In other embodiments, the motor frame 110 can include a mounting flange that enables the electric motor 102 to be mounted in different orientations, for example, at the drive end 114.

The motor enclosure 110 can be designed in accordance with various industry recognized standards for motor enclosures such as the Nation Electrical Manufacturers Association (NEMA) enclosure standards or the International Electrotechnical Commission (IEC) standards. These standards may define the type of enclosure for the electric motor 102 including the types of protection against ingress of dust or water, the type of cooling or heat removal such as air convection or fan cooled, and its suitability for different operating environments and hazards. For example, the electric motor 102 may be designed as an opened drip proof (ODP) motor that may include vents to the ambient environment or totally enclosed fan cooled (TEFC) motor that is enclosed to the environment to prevent dirt or water from entering and is cooled by an external fan. The standards may also relate to frame size or frame configuration of the motor enclosure 108 that can specify the configuration and dimensions for various mounting structures such the mounting feet 118 at the base of the motor enclosure 108. The frame size may also specify the position and extension of the motor shaft 106 with respect to the mounting feet 118. Standardization of these aspects facilitates compatibility of the electrical motors 102 in different industrial settings.

The motor frame 110 can be assembled from a plurality of components including a first end shield 120 situated at the drive end 114, an axially opposed second end shield 122 situated at the non-drive end 116, and a stator sleeve 124 or yoke that is configured as a tubular or sleeve-like structure extending between the first and second end shields 120, 122. The first end shield 120 corresponds and may also be referred to as the drive end shield and the second end shield 122 corresponds to the non-drive end (NDE) end shield. The stator sleeve 124 is aligned with the rotational axis 108 and provides the structural exterior that surrounds and defines the enclosed interior 112. The first and second end shields 120, 122, also referred to as end bells or brackets, securely attach to the axially opposed ends of the stator sleeve 124 and physically support the motor shaft 106 extending through the enclosed interior 112. Typically, the first and second end shields 120, 122 can be attached to the stator sleeve 124 by threaded fasteners, although in possible embodiments, one or more of the components may be integrally cast together. The first and second end shields 120, 122 and the stator sleeve 124 can be made from metal such as iron, steel, or aluminum that is cast or extruded into the desired shape. In the illustrated electric motor 100, the stator sleeve 124 can be generally cubic in shape and the first and second end shields 120, 122 may have complementary shapes; however, in other designs of the electric motor 102 the stator sleeve 124 may be cylindrical and the first and second end shields 120, 122 may be circular.

To cause the motor shaft 106 to rotate with respect to the rotational axis 108, the electric motor 102 can include a stator 126 and an electromagnetically interacting rotor 128 accommodated in the enclosed interior 112 defined by the motor frame 110. The stator 126 can be a stationary annular structure that is fixedly mounted to the interior of the stator sleeve 124 and concentric about the rotational axis 108. In an AC induction motor, the stator 126 may be made of a plurality of windings or coils which are conductive and which can receive electricity from an external source. The rotor 128 can be formed on and radially disposed about the motor shaft 106 such that, in operation, the rotor assembly rotates with the motor shaft. The rotor 128 can be made of a corresponding set of electromagnetically reactive coils, bars, or laminations radially attached to the motor shaft 106.

When alternating current is supplied to the coils of the stator 126, it generates a rotating magnetic field that induces a current to flow in the conductors of the rotor 128. The flow of current in the rotor 128 produces a secondary magnetic field that interacts with the rotating magnetic field or flux from the stator 126 causing the rotor to follow the primary field and generate rotary motion and torque. The rotational forces applied to the rotor 128 thus cause rotation of the motor shaft 106 with respect to the motor frame 110.

To enable relative rotation of the motor shaft 106 and the motor frame 110, the motor shaft 106 can be supported at the drive end 114 and the non-drive end 116 by bearings 130 fitted into corresponding bearing apertures disposed in the first and second end shields 120, 122. The bearings 130 can be fixedly set into the bearing apertures by set screws or the like and enable the motor shaft 106 to rotatably connect with and protrude through the first and second end shields 120, 122.

The electromagnetic interaction between the stator 126 and rotor 128 generates thermal energy in the form of heat within the enclosed interior 112 and the structural components of the electric motor 102. To transfer the heat energy, the motor frame 110 can be formed with a plurality of exterior cooling fins 132 that may dissipate heat to the surrounding environment. The external cooling fins 132 provide additional surface area to promote heat transfer to the surrounding air by convection. The cooling fins 132 can be generally parallel with the rotational axis 108 and can extend in the longitudinal direction generally between the drive end 114 and the non-drive end 116. The cooling fins 132 may be integrally formed on and project from the stator sleeve 124, although other locations and arrangements of the cooling fins are contemplated.

To further promote cooling, the electric motor 102 may be configured as a totally enclosed fan cooled (TEFC) motor that can include a cooling fan unit 134 at the non-drive end 116 of the motor frame 110. For example, the cooling fan unit 134 can be axially attached to the exterior of the second end shield 122 and can be oriented to direct airflow axially over the exterior of the stator sleeve 124 and in fluid communication with the exterior cooling fins 132. The cooling fan unit 134 can include a fan impeller 136 having a plurality of radially arranged and extending fan blades that, when rotated, act to generate airflow. To cause rotation, the fan impeller 136 can be fixedly secured to the end of the motor shaft 106 that protrudes through the second end shield 122. To enclose the fan impeller 136, for example, to prevent unintentional contact, the cooling fan unit 134 can include a fan cover 138 that attaches to the second end shield 122. The fan cover 138 can be formed of sheet metal, for example, pressed aluminum, and can be a box-like structure that surrounds and encloses the fan impeller 136. In a particular example, the fan cover 138 may include a peripheral cover sidewall and an axial cover face that is axially spaced from the second end shield 122 and which may include a grate with vents to allow airflow there through.

To adjust operation of the electrical motor 102, the drive unit 104 can vary the electrical power received from the external source in accordance with the desired performance of the integrated motor-drive 100. For example, the drive unit 104 can vary the current applied to the electric motor 102 which is proportional to the motor torque. To change the motor speed, the drive unit 104 can vary the electrical frequency of the A-C power source to speed up or slow down the electric motor 102.

The components of the drive unit 104 can be physically accommodated in a drive enclosure 140 that is configured as a box-like structure that may be attached to the motor frame 110 of the electric motor 102. The drive enclosure 140 can be made from any suitable material such as molded thermoplastic and can include a rectangular enclosure base 142 that is enclosed by a correspondingly shaped attachable enclosure cover 144. The enclosure base 142 and enclosure cover 144 can be releasably secured by threaded fasteners or the like.

To vary the electrical power applied to the electric motor 102, accommodated inside the drive enclosure 140 can be a printed circuit board 146 to which are mounted various electrical components 148 such as transformers, capacitors, transistors and the like. The electrical components 148 can be electrically connected together through the printed circuit board 146 to cooperatively interact as an electrical circuit to control and regulate the electrical power from an external source and that is applied to the electric motor 102.

To combine the electric motor 102 and the drive unit 104 in accordance with the physical configuration of an integrated motor-drive 102, a mounting structure referred to herein as a cantilevered heatsink 150 is included that connects the drive enclosure 140 with the motor frame 110. For example, the cantilevered heatsink 150 can be purposely configured to spatially suspend the drive unit 104 over the electric motor 102 while minimizing physical contact with the motor frame 110. The cantilevered heatsink 150 can be physically connected primarily with the second end shield 122 of the motor frame 110 while spatially separated and isolated from the stator sleeve 124 by a heatsink air gap 152 due to the cantilevered arrangement. The arrangement conducts thermal heat, via conduction, to the second end shield 122 that is in close proximity to the cooling fan unit 134 and which may be maintained at a reduced temperature and experience significant heat dissipation through convective thermal transfer to the generated airflow. The second end shield 122 may include cooling fins radially protruding from its outer diameter to improve heat dissipation by convection.

The cantilevered heatsink 150 can be designed to support the drive unit 104 above the motor frame 110 in what can be referred to as a top mounted arrangement. In the top mounted arrangement, the drive unit 104 is located opposite the bottom mounting feet 118 and is radially offset with respect to the rotational axis 108 of the electric motor 102. The drive enclosure 140 is thus accessible from above the integrated motor-drive unit 100 to connect and configure the electrical components 148 therein. Other configurations of the cantilevered heatsink 150 may position the drive unit 104 in different spatial arrangements with respect to the motor frame 110.

Figure 3:
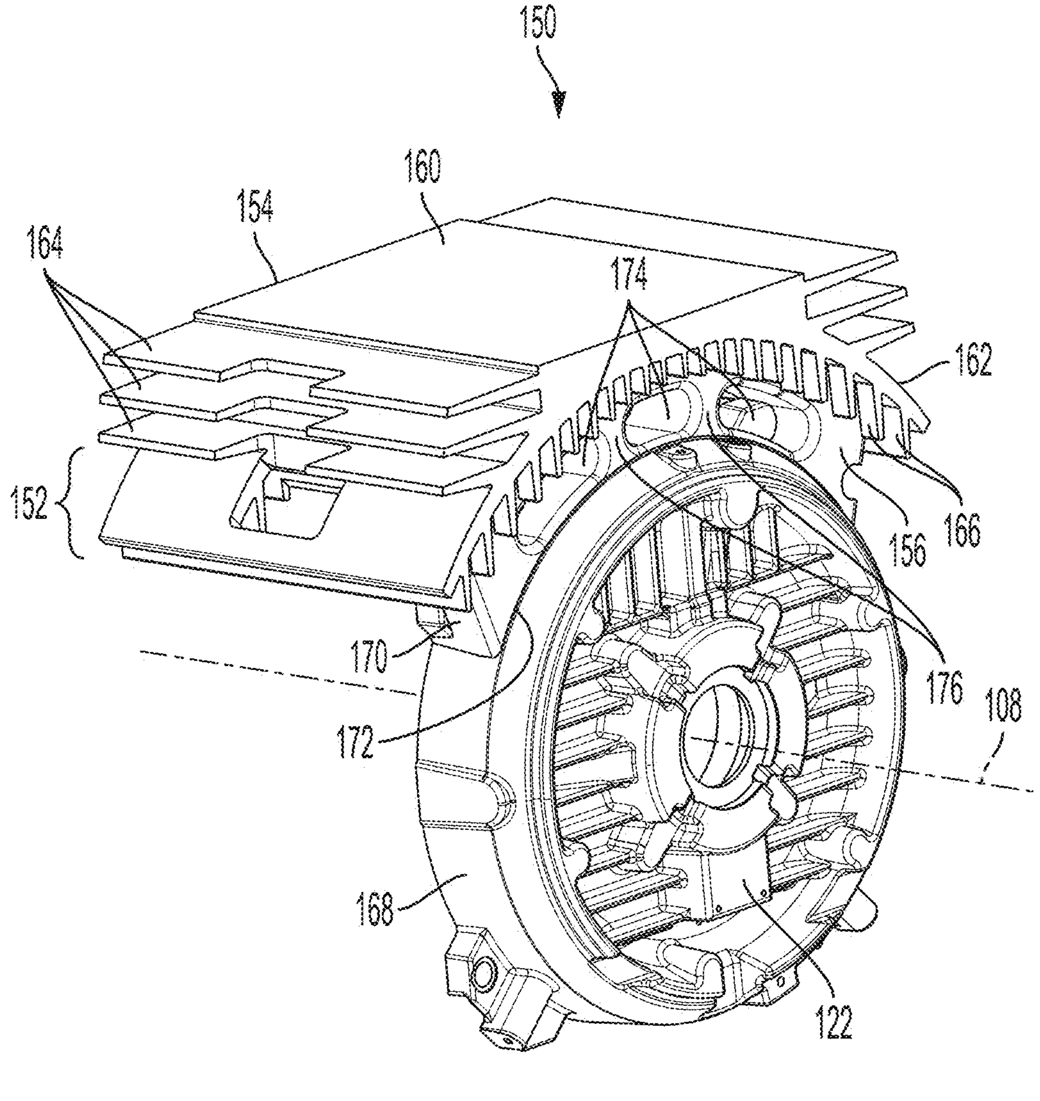
FIG. 3 is a perspective view of an example of the cantilevered heatsink physically and thermally connected to the peripheral rim of the end shield of the motor frame.
Figure 4:
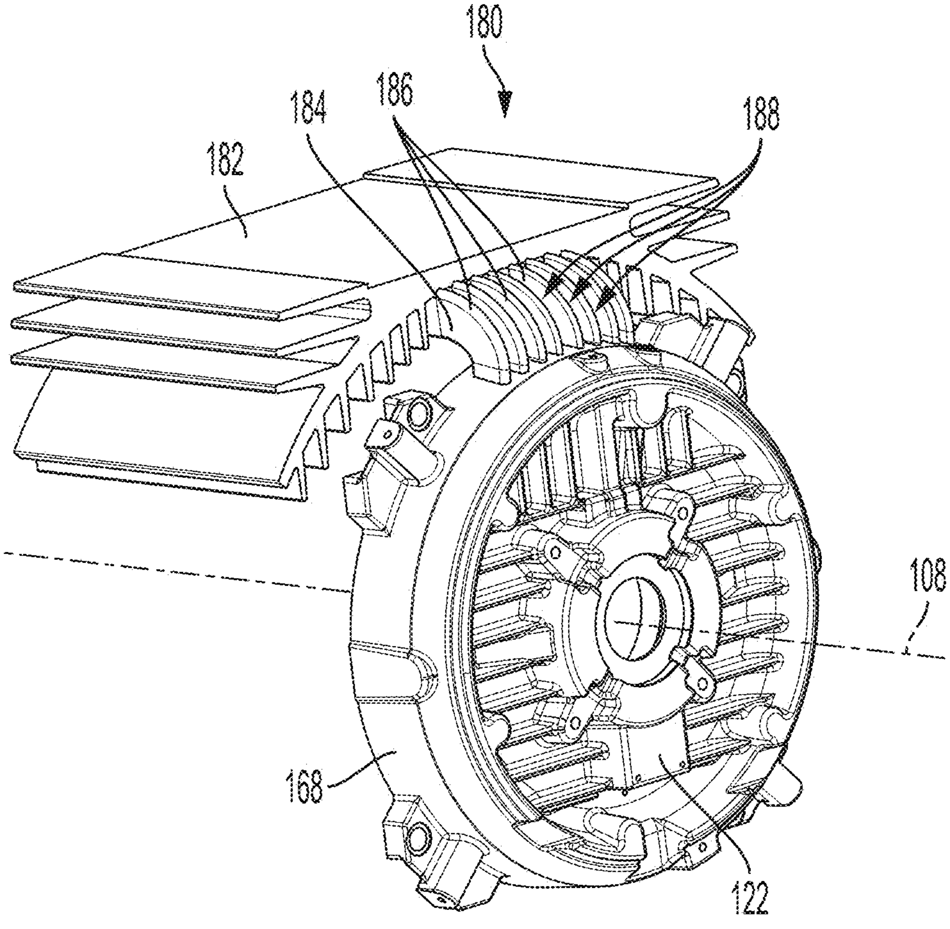
FIG. 4 is a perspective view of another example of the cantilevered heatsink integrally formed with the end shield of the motor frame.

Referring to FIGS. 3 and 4, the cantilevered heat sink 150 can include a drive platform 154 which the drive unit 104 is intended to be mounted upon and a heatsink support 156 that is formed at an edge of the drive platform to connect with the second end shield 122. The drive platform 154 and the heatsink support 156 can be orthogonally arranged so that when the cantilevered heatsink 150 is assembled to the electric motor 102, the cantilevered platform 154 is radially offset with respect to the rotational axis 108 and the heatsink support 156 is perpendicular or normal to the rotational axis 108.

The drive platform 154 can define a planar surface 160 that is rectangular in shape and extends in the lateral and longitudinal directions with respect to the electrical motor 102. The lateral extension of the planar surface 160 can be less than the lateral width of the electrical motor 102 and the longitudinal extension can be approximately half of the longitudinal axial length of the motor. The rectangular planar surface 160 provides a flat shape that the correspondingly flat bottom surface of the enclosure base 142 of the drive unit 104 can be mounted on, for example, by fasteners. When the cantilevered heatsink 150 is attached to the second end shield 122, the planar surface 160 is situated in a plane that is radially offset from the rotational axis 108 in a nonconvergent arrangement. The planar surface 160 is therefore parallel in planar extension with respect to the rotational axis 108.

The drive platform 154 can include an arcuate arch 162 is that is located opposite and that curves away from the planar surface 160. The arcuate arch 162 can be radially curved with respect to the rotational axis 108 and may have an angular extension of approximately 120°, thereby forming a curved arc or segment. The arcuate arch 162 can also be longitudinally coextensive in the axial direction with the planar surface 160. In the embodiment wherein the stator sleeve 124 is cylindrical, the arcuate arch 162 can conform in curved shape with the exterior of the motor frame 110.

To further dissipate heat energy, the drive platform 154 can include a plurality of heatsink fins 164 that protrude from either lateral side of the drive platform 154 and that extend longitudinally in the axial direction of the rotational axis 108. The plurality of heatsink fins 164 can be parallel to each other and vertically spaced apart between the planar surface 160 and the arcuate arch 162. Heat transferred from the drive unit to the drive platform 154 can be dissipated by thermal convection via the lateral heatsink fins 164.

Furthermore, a plurality of arch fins 166 can spatially depend from the inwardly curved surface of the arcuate arch 162 to provide further heat dissipation and cooling. The plurality of arch fins 166 can be coextensive with the longitudinal length of the drive platform 154 and can be arranged parallel and laterally spaced apart with respect to the rotational axis 108 and each other. When the cantilevered heatsink 150 is connected with the second end shield 122, the arch fins 166 can depend radially toward the motor frame 110. As shown in FIG. 2, the arch fins 166 can be situated in the heatsink air gap 152 and convectively communicate thermal energy thereto.

If required for structural support, one or more standoffs can be located in heatsink air gap 152 extending between the top of the motor frame 110 and the lower arcuate arch 162 at the bottom of the drive platform 154. The standoffs can support the cantilevered arrangement of the drive platform 154 with respect to the motor frame 102. The standoffs may be made of a thermal insulator such as plastic.

To physically connect the cantilevered heatsink 150 with the second end shield 122, the heatsink support 156 can be formed at the longitudinal rearward edge of the drive platform 160 and can extend downwardly from the arcuate arch 162. The heatsink support 156 can therefore have a similar curved shape with the arcuate arch 162 and can geometrically conform in shape with the second end shield 122. For example, the second end shield 122 can be round or circular and can include a circular edge or peripheral rim 168 that is concentric to the rotational axis 108. The heatsink support 156 can have a corresponding arcuate shape to geometrically conform with the circular peripheral edge 168 of the second end shield 122.

The heatsink support 154 can be formed as a brace segment 170 that structurally joins the arcuate arch 162 of the drive platform 154 to the curved peripheral rim 168 of the second end shield 122 and that is annularly disposed there between. Geometrically, the brace segment 170 can radially curve with respect to the rotational axis 108 and can have an angular extension or length of approximately 120°. The shaped of the brace segment 170 may therefore curve parallel with the circular shape of the peripheral rim 168 of the second end shield 122.

The brace segment 170 may include a curved abutment edge 172 that is radially disposed inward of the arcuate arch 162 and that contacts and interfaces with the exterior of the peripheral rim 168 of the second end shield 122. The brace segment 170 can extend perpendicularly from the arcuate arch 162 and can perpendicularly and laterally traverse the rotational axis 108. The structure of the heatsink support 156 is located proximate to the longitudinally rearward edge of the drive platform 154.

The radial offset created by the brace segment 170 may delineate in part the heatsink air gap 152 between the drive platform 154 and the upper surface of the motor frame 110 when the cantilevered heatsink 150 is connected thereto. To direct airflow to the heatsink air gap 152, the brace segment 170 can include one or more airflow channels 174 disposed therein. The airflow channels 174 can be longitudinally arranged parallel with the rotational axis 108 to align and direct airflow accordingly. The airflow channels 174 can be located underneath the arcuate arch 162 to radially align with the heatsink air gap 152. The airflow channels 174 can be angularly spaced apart from each other and separated by a corresponding number of segment posts 176 that extend in the radial direction between the arcuate arch 162 and the curved abutment edge 172. Any suitable number of airflow channels 174 and segment posts 176 can be included in the brace segment 170 so long as the structure of the brace segment 170 can continue to support the weight of the motor drive.

To thermally conduct heat energy to the second end shield 122, the cantilevered heatsink 150 can be formed of a metallic material such as aluminum or steel, for example, by extrusion or casting. The cantilevered heatsink 150 can be formed as a separate component and can be physically attached to the second end shield 122 by fasteners or the like. For example, fasteners can be secured through the peripheral rim 168 of the second end shield 122 into the segment posts 176 of the brace segment 170. The curved abutment edge 172 thus physically contacts the peripheral rim 168 of the thermal conduction of heat energy there between. Furthermore, the cantilevered heatsink 150 and the second end shield 122 can be an unitary structure with the brace segment 170 and the peripheral rim 168 integrally joined, for example, by casting, for example, the structure may be die-cast aluminum.

Figure 5:
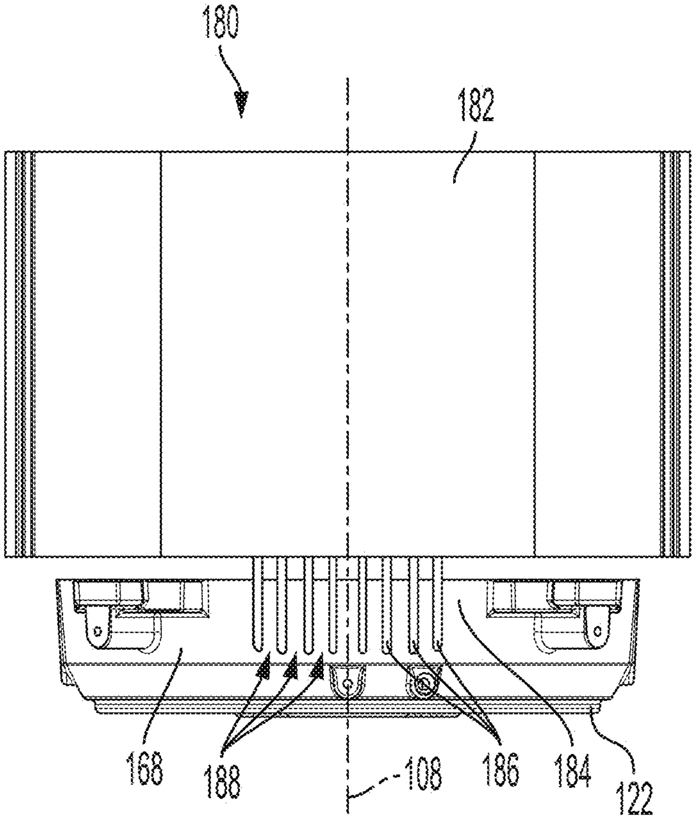
FIG. 5 is a top plane view of the second example of the cantilevered heatsink axially shifted downstream of the end shield of the motor frame.

Referring to FIGS. 5 and 6, there is illustrated another example of cantilevered heatsink 180 that can be formed as an integral structure, or alternatively an assembly, with the second end shield 122. The second cantilevered heatsink 180 can also include a drive platform 182 to which the drive unit can mount and a heatsink support 184 to connect with the second end shield 122. The drive platform 182 may be similarly configured as described above. The heatsink support 184, however, can be configured to further promote thermal energy transfer by thermal convection and conduction.

For example, the heatsink support 184 can comprise a plurality of brace elbows 186 that extend between and physically connect the curved peripheral rim 168 of the second end shield 122 with the longitudinally rearward edge of the drive platform 182. The plurality of brace elbows 186 can each be aligned and radially offset from the rotational axis 108 of the electric motor 102. Each brace elbow 186 can be structurally shaped as a 90° annular segment that arranges the second end shield 122 and the drive platform 182 orthogonal or perpendicular to each other. The 90° configuration of the elbow braces 186 can shift the drive platform 182 longitudinally forward of the second end shield 122 with respect to the rotational axis 108.

The plurality of brace elbows 186 can further be arranged parallel and angularly spaced apart with respect to each other and the rotational axis 108 to define air channels 188 there between. The airflow channels 188 may be therefore aligned with the heatsink air gap 152 when the cantilevered heatsink 180 is attached to the motor frame 110. The brace elbows 186 may also align with the individually corresponding arch ribs radially depending from the drive platform 182 so that that the airflow channels 188 direct airflow to the spaces there between. The longitudinally forward shift of the drive platform 182 with respect to the second end shield 122 along the axis line 108 also creates exposure that directs airflow underneath the drive platform.

Heat transfer through conduction and convection resulting from the arrangement of the cantilevered heatsink can be explained with reference to FIG. 2. When assembled, the cantilevered heatsink 150 is attached to the second end shield 122 that is axially situated between the remainder of the motor frame 110 oriented toward the drive end 114 and the cooling fan unit 134 oriented toward the non-drive end 116. The drive unit 104, when mounted to the cantilevered heatsink 150, is in the top mounted arrangement situated over the motor frame 110 and spatially and thermally separated therefrom by the heatsink air gap 152. Because the drive platform 154 can be made from a thermally conductive material, the drive platform can receive or draw heat generated by drive unit mounted thereon, part of which may be dissipated via the heatsink fins 164. Additional thermal conduction of heat energy generate by the drive unit 104 can be directed through the cantilevered heatsink 150 to the second end shield 122 through the physical connection of the heatsink support 156. Thermal conduction from the motor frame 110 is also directed to and may be dissipated by the second end shield 122, which is cooler. Thus, direct thermal conduction between the motor frame 110 and the cantilevered heatsink 150 is prevented by the cooler second end shield 122 which establishes a thermal gradient to thermally isolate those components that are typically hotter.

Further, the connection of cantilevered heatsink 150 and the second end shield 122 axially adjacent to the cooling fan unit 134 promotes cooling by thermal convection. For example, directing airflow against the second end shield 122 can dissipate heat directed thereto from the drive unit 104 through physical connectivity with the cantilevered heatsink 150. Additionally, airflow generated by the enclosed fan impeller 136 can be directed into the heatsink air gap 152 between the drive platform and the exterior of the motor frame 110 through the plurality of airflow channels 174 disposed into the heatsink support 156. Thermal heat retained in the drive platform 154 can be dissipated to the airflow in the heatsink air gap 152 via convection with the arch fins 166 situated therein. The box-like fan cover 138 can be configured to spatially encompass and extend over at least a portion of the heatsink support 156 to direct airflow there through and into the heatsink air gap 152.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

The invention claimed is:

1. An integrated motor-drive comprising:

an electric motor defining a drive end and a non-drive end, the electric motor including:

a motor frame having a first end shield at the drive end, a second end shield at the non-drive end, and a stator sleeve extending between the first end shield and the second end shield;

a motor shaft extending between and rotatably supported by first end shield and the second end shield, the motor shaft defining a rotational axis of the electric motor;

a cooling fan unit axially mounted to the second end shield and axially opposite the stator sleeve;

a drive unit including a plurality of electrical components for regulating electrical operation of the electric motor; and a cantilevered heatsink including a drive platform for mounting the drive unit on and a heatsink support physically connecting the drive platform to the second end shield so that the drive platform is cantilevered over and separated from the motor frame by a heatsink air gap;

wherein the drive platform has a planar surface rectangular in shape and situated in a plane offset and parallel to the rotational axis;

wherein the drive platform includes an arcuate arch curved away from the planar surface and curving parallel with a circular peripheral rim of the second end shield; and wherein the drive platform includes a plurality of lateral heatsink fins parallel with the planar surface and extending laterally from the arcuate arch.

2. The integrated motor-drive of claim 1, wherein the drive platform further includes a plurality of arch fins depending from the arcuate arch into the heatsink air gap.

3. The integrated motor-drive of claim 2, wherein the plurality of arch fins extends longitudinally parallel to the rotational axis.

4. The integrated motor-drive of claim 1, wherein the cantilevered heatsink is integrally attached with the second end shield.

5. An integrated motor-drive comprising:

an electric motor defining a drive end and a non-drive end, the electric motor including:

a motor frame having a first end shield at the drive end, a second end shield at the non-drive end, and a stator sleeve extending between the first end shield and the second end shield;

a motor shaft extending between and rotatably supported by first end shield and the second end shield, the motor shaft defining a rotational axis of the electric motor;

a cooling fan unit axially mounted to the second end shield and axially opposite the stator sleeve;

a drive unit including a plurality of electrical components for regulating electrical operation of the electric motor; and a cantilevered heatsink including a drive platform for mounting the drive unit on and a heatsink support physically connecting the drive platform to the second end shield so that the drive platform is cantilevered over and separated from the motor frame by a heatsink air gap;

wherein the heatsink support includes a plurality of airflow channels in fluid communication with the heatsink air gap to receive airflow directed from the cooling fan unit; and wherein the heatsink support includes a plurality of brace elbows that are parallel and spaced apart with each other and the airflow channels disposed between the brace elbows.

6. The integrated motor-drive of claim 5, further comprising a cooling fan unit axially mounted to the second end shield and axially opposite the stator sleeve.

7. The integrated motor-drive of claim 6, wherein the drive platform has a planar surface rectangular in shape and situated in a plane offset and parallel to the rotational axis.

8. The integrated motor-drive of claim 7, wherein the drive platform includes an arcuate arch curved away from the planar surface and curving parallel with a circular peripheral rim of the second end shield.

9. The integrated motor-drive of claim 8, wherein the drive platform includes a plurality of lateral heatsink fins parallel with the planar surface and extending laterally from the arcuate arch.

10. The integrated motor-drive of claim 5, wherein the heatsink support includes an abutment edge adjacently interfacing with a circular peripheral rim of the second end shield.

11. The integrated motor-drive of claim 10, wherein the heatsink support is configured as a brace segment including a plurality of segment posts that spatially separate each of the plurality of airflow channels.

12. A cantilevered heatsink for attaching an electric motor and a drive unit in an integrated motor-drive comprising:

a drive platform including a rectangular planar surface for mounting the drive unit to and an arcuate arch curving away from the rectangular planar surface to delineate a heatsink air gap with a motor frame when attached with the electric motor; and a heatsink support orthogonally joined at and extending from an edge of the rectangular planar surface, the heatsink support having a curved abutment edge to interface with a circular peripheral rim of the motor frame of the electric motor, the heatsink support further having a plurality of airflow channels disposed therein establishing fluid communication with the heatsink air gap delineated by the arcuate arch;

wherein the drive platform includes a plurality of arch fins depending from the arcuate arch, the plurality of arch fins parallel and spaced apart with respect to each other.

13. The cantilevered heatsink of claim 12, wherein the drive platform includes a plurality of lateral heatsink fins extending laterally with respect to and parallel with the rectangular planar surface.

14. The cantilevered heatsink of claim 12, wherein the heatsink support is configured as a brace segment including a plurality of radial segment posts respectively separating the plurality of airflow channels.

15. The cantilevered heatsink of claim 12, further comprising a circular end shield of the motor frame integrally joined to the abutment edge of the heatsink support.

16. A cantilevered heatsink for attaching an electric motor and a drive unit in an integrated motor-drive comprising:

a drive platform including a rectangular planar surface for mounting the drive unit to and an arcuate arch curving away from the rectangular planar surface to delineate a heatsink air gap with a motor frame when attached with the electric motor; and a heatsink support orthogonally joined at and extending from an edge of the rectangular planar surface, the heatsink support having a curved abutment edge to interface with a circular peripheral rim of the motor frame of the electric motor, the heatsink support further having a plurality of airflow channels disposed therein establishing fluid communication with the heatsink air gap delineated by the arcuate arch;

wherein the heatsink support is configured as a plurality of brace elbows that are parallel and spaced apart with each other with the airflow channels disposed between the brace elbows.

* * * * *